United States Patent [19]
Vinciarelli et al.

[11] Patent Number: 5,526,234
[45] Date of Patent: Jun. 11, 1996

[54] PACKAGING ELECTRICAL COMPONENTS

[75] Inventors: Patrizio Vinciarelli, Boston; Fred Finnemore, No. Reading; John S. Balog, Mendon; Brant T. Johnson, Concord, all of Mass.

[73] Assignee: VLT Corporation, San Antonio, Tex.

[21] Appl. No.: 143,173

[22] Filed: Oct. 26, 1993

Related U.S. Application Data

[62] Division of Ser. No. 914,347, Jul. 17, 1992, abandoned.

[51] Int. Cl.⁶ .................................................. H05K 1/14
[52] U.S. Cl. ..................... 361/740; 174/50.5; 174/52.2; 361/728
[58] Field of Search ................................. 361/692, 704, 361/707, 728, 730, 732, 740, 752, 758, 759, 801; 174/50.5, 52.2, 52.3

[56] References Cited

U.S. PATENT DOCUMENTS

| | | |
|---|---|---|
| 3,621,338 | 11/1971 | Rogers et al. . |
| 3,683,241 | 8/1972 | Duncan . |
| 3,737,729 | 6/1973 | Carney ............................ 361/395 |
| 4,218,725 | 8/1980 | Kaufman ......................... 361/395 |
| 4,400,762 | 8/1983 | Bartley et al. . |
| 4,417,296 | 11/1983 | Schelhorn . |
| 4,531,145 | 7/1985 | Wiech, Jr. . |
| 4,551,746 | 11/1985 | Gilbert et al. . |
| 4,551,747 | 11/1985 | Gilbert et al. . |
| 4,554,613 | 11/1985 | Kaufman ......................... 174/52.2 |
| 4,724,283 | 2/1988 | Shimada et al. . |
| 4,740,414 | 4/1988 | Shaheen . |
| 4,750,089 | 6/1988 | Derryberry et al. . |
| 4,769,525 | 9/1988 | Leatham . |
| 4,783,695 | 11/1988 | Eichelberger et al. . |
| 4,783,697 | 11/1988 | Benenati et al. . |
| 4,840,286 | 6/1989 | Heberling et al. ............. 361/692 |
| 4,847,136 | 7/1989 | Lo . |
| 4,872,081 | 10/1989 | Murphy et al. ................ 361/395 |
| 4,879,630 | 11/1989 | Boucard et al. . |
| 4,899,257 | 2/1990 | Yamamoto ..................... 174/52.2 |
| 4,918,811 | 4/1990 | Eichelberger et al. . |
| 4,953,005 | 8/1990 | Carlson et al. . |
| 4,994,215 | 2/1991 | Wiech, Jr. . |

(List continued on next page.)

FOREIGN PATENT DOCUMENTS

| | | | |
|---|---|---|---|
| 0141582 | 5/1985 | European Pat. Off. . | |
| 3323604 | 1/1985 | Germany | 361/752 |
| 4287396 | 10/1992 | Japan | 361/704 |

OTHER PUBLICATIONS

Gates and Yokoro; "Sealed Chip–On–Board Circuit Protection"; 3rd International SAMPE Electronics Conference; Jun. 20–22, 1989; pp. 929–938.

*Primary Examiner*—Gregory D. Thompson
*Attorney, Agent, or Firm*—Fish & Richardson

[57] ABSTRACT

A package for electrical components in which a circuit board holds the components. The package includes an enclosure having generally parallel, spaced apart upper and lower internal surfaces. The circuit board lies generally parallel to the lower internal surface with the electrical components held in an internal-space between the circuit board and the upper internal surface. Conductive terminal pins extend from outside the enclosure into the internal space. The terminal pins are connected to the circuit board by conductive links, each link having an end attached to the periphery of the circuit board and another end projecting into the internal space.

In other aspects, a resilient non-compressive encapsulant is used to fill a space within the package; an electronic component is mounted with a power-dissipating device sitting in the aperture of a circuit board, a power-dissipating surface in contact with a baseplate, and contact pads electrically connected to the circuit board; terminal pins are connected to a circuit board using a fence connected at the periphery of the circuit board, the fence extending substantially perpendicularly to the circuit board, the fence comprising at least two conductive links joined by a severable junction.

3 Claims, 13 Drawing Sheets

U.S. PATENT DOCUMENTS

| | | | |
|---|---|---|---|
| 5,001,603 | 3/1991 | Villanenva, III et al. | 361/752 |
| 5,006,673 | 4/1991 | Freyman et al. | |
| 5,019,941 | 5/1991 | Craft. | |
| 5,019,946 | 5/1991 | Eichelberger et al. | |
| 5,028,987 | 7/1991 | Neugebauer et al. | |
| 5,111,362 | 5/1992 | Flamm et al. | 361/752 |
| 5,258,888 | 11/1993 | Korinsky | 361/704 |

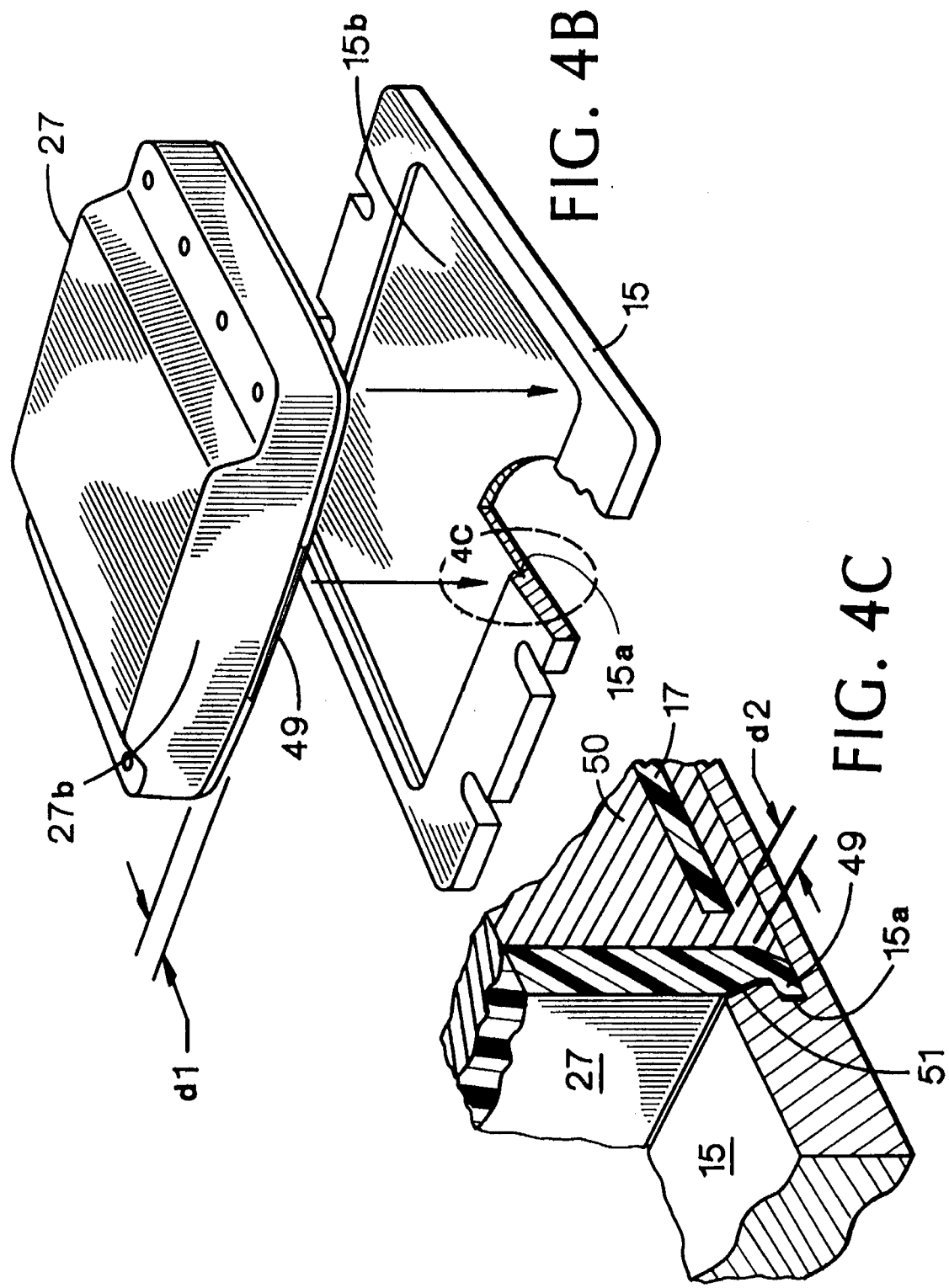

PACKAGING ELECTRICAL COMPONENTS

This is a divisional of application Ser. No. 07/914,347, filed Jul. 17, 1992, now abandoned.

BACKGROUND OF THE INVENTION

This invention relates to packaging electrical components.

One approach to packaging electrical components (FIG. 1) includes a housing which both encloses the components and aids in the removal of heat from power dissipating components within the housing. The housing includes a non-conductive casing 5 and an aluminum heat-sinking base 6. A printed circuit board (PCB) 3 is mounted next to the upper wall 5a of the casing. Conductive pins 7 are attached directly to the PCB 3 and extend up through wall 5a. Electronic components 9a, 9c are mounted to one or both sides of the PCB 3 (upper side 3a and lower side 3b). Larger components such as inductor 9c are mounted to the lower side 3b for space reasons. Power-dissipating components 9b are mounted directly to the baseplate 6 for better heat transfer. Component 9b is electrically connected to the PCB by leads 12.

The pins 7 allow assembly 1 to be mounted to a circuit board 14; the baseplate 6 provides a flat, thermally conductive surface from which heat generated within the assembly may be removed by free or forced convection or by mounting a heat sink (not shown) to the surface of the baseplate.

Assembly 1 is filled with an epoxy encapsulant which becomes relatively rigid upon curing. The encapsulant acts as a thermal spreader and provides mechanical support. To assure that the case and base are held together tightly, a pocket 6a is formed in the baseplate with undercuts 6b formed along the edge of the pocket. The encapsulant extends into the undercuts and has enough tensile strength to minimize the chances of the case been pulled away from the base. To protect the components from damage by shrinkage of the stiff encapsulant which may occur during curing or exposure to low temperatures, sensitive components (e.g., glass diodes, ceramic resistors or capacitors, magnetic cores) are covered with a "buffer coating" of a soft, rubbery material.

SUMMARY OF THE INVENTION

The invention provides packaging which is compact and inexpensive and easy to manufacture, provides good heat sinking capability, and makes optimal use of the available space within the case. It can be mounted easily on an external circuit board, with minimal use of space, and can be easily demounted and remounted.

Thus, in general, in one aspect, the invention features a package for electrical components held on a circuit board. The package includes an enclosure having generally parallel, spaced apart upper and lower internal surfaces. The circuit board lies generally parallel to the lower internal surface with the electrical components held in an internal space between the circuit board and the upper internal surface. Conductive terminal pins extend from outside the enclosure into the internal space. The terminal pins are connected to the circuit board by conductive links, each link having an end attached to the periphery of the circuit board and another end projecting into the internal space.

Embodiments of the invention include the following features. The links are flat metal pieces and are perpendicular to the board. The enclosure includes a base bearing the lower internal surface and a case bearing the upper internal surface. The base is a thermally conductive plate. A power-dissipating component is mounted on the plate. The case has an upper wall bearing the upper internal surface and a step connected by a sloped transition to the upper wall, and the pins pass through the step. Some of the links have a broader conductive connection to the board than other links. The pins are spaced a sufficient distance from the transition to allow the pins and the upper wall to pass through respective distinct holes in an external circuit board. A ferrite ring may lie around one of the pins adjacent the step. The end of each link which projects into the internal space has a portion bent to extend parallel to the circuit board, and the pins are connected to the bent portions. One of the electrical components lies in the space between the circuit board and one of the bent portions. One of the links extends around a corner of the circuit board. There may be two sets of links, arranged respectively along opposite peripheral edges of the circuit board.

In general, in another aspect, two opposing side walls of the case have respective teeth extending laterally in opposite directions and away from each other. The base has two opposing detents extending laterally in opposite directions, the detents being located and configured to permit the case to be snapped onto the base with the teeth held under the detents. A non-compressible resilient encapsulating material completes a non-compressible span of encapsulating material and components extending between the places on the two side walls of the case where the teeth are located. The span of encapsulating material and components includes a circuit board mounted within the package and between the places on the two side walls of the case where the teeth are located. The side walls are resilient and biased to apply outward lateral forces to the teeth when the case is mounted on the base.

In general, in another aspect, the invention features a structure comprising a thermally conductive baseplate, a circuit board parallel and adjacent to the baseplate, an electronic component including a power-dissipating electronic device, a power-dissipating surface, and pads for making electrical connection to the device. The circuit board has an aperture, the electronic component being mounted with the power-dissipating device sitting in the aperture of the board, the power-dissipating surface in contact with the baseplate, and the pads electrically connected to the circuit board.

Embodiments of the invention include the following features. The electronic component includes a thermally conductive substrate. The power-dissipating device and the pads are mounted on one side of the substrate and the power-dissipating surface is on the opposite side of the substrate. The board includes a metal-lined through-hole, and the pads are soldered to the through-hole.

In general, in another aspect, the invention features a method for mounting a power-dissipating component having contact pads. In the method, the component is mounted on a thermally conductive baseplate. A circuit board having an aperture is placed over the component with at least part of the power-dissipating device lying in the aperture. Then the pads are soldered to the circuit board.

Embodiments of the invention include the following features. Solder is applied to the circuit board. The circuit board is pre-heated to below the melting temperature of the solder, the baseplate and the substrate are preheated to a temperature above the melting temperature of the solder. The circuit board is placed adjacent the substrate to cause the solder in the circuit board to melt.

Contact pads are mounted on the substrate and connected to the power-dissipating device. Wires are bonded to the pads and to the power-dissipating device. A metal-lined through hole is formed in the circuit board at the site where the pads are to be soldered to the circuit board.

In general, in another aspect, the invention features a method for connecting terminal pins to a circuit board. An electrically conductive fence is provided having two conductive links joined by a severable junction. Each conductive link has a bent portion. A terminal pin is attached to the bent portion of each link. The fence is attached along the periphery of the circuit board, the fence extending substantially perpendicularly to the circuit board, with the bent portion lying generally parallel to and spaced apart from the circuit board. Then the junction is severed.

A variety of other advantages and features will become apparent from the following description and from the claims.

DESCRIPTION

FIG. 4b is an exploded perspective cutaway view of the case and baseplate.

FIG. 4c is a side sectional view, enlarged of a portion of FIG. 4b.

DESCRIPTION OF THE PREFERRED EMBODIMENTS

Figure 2A:
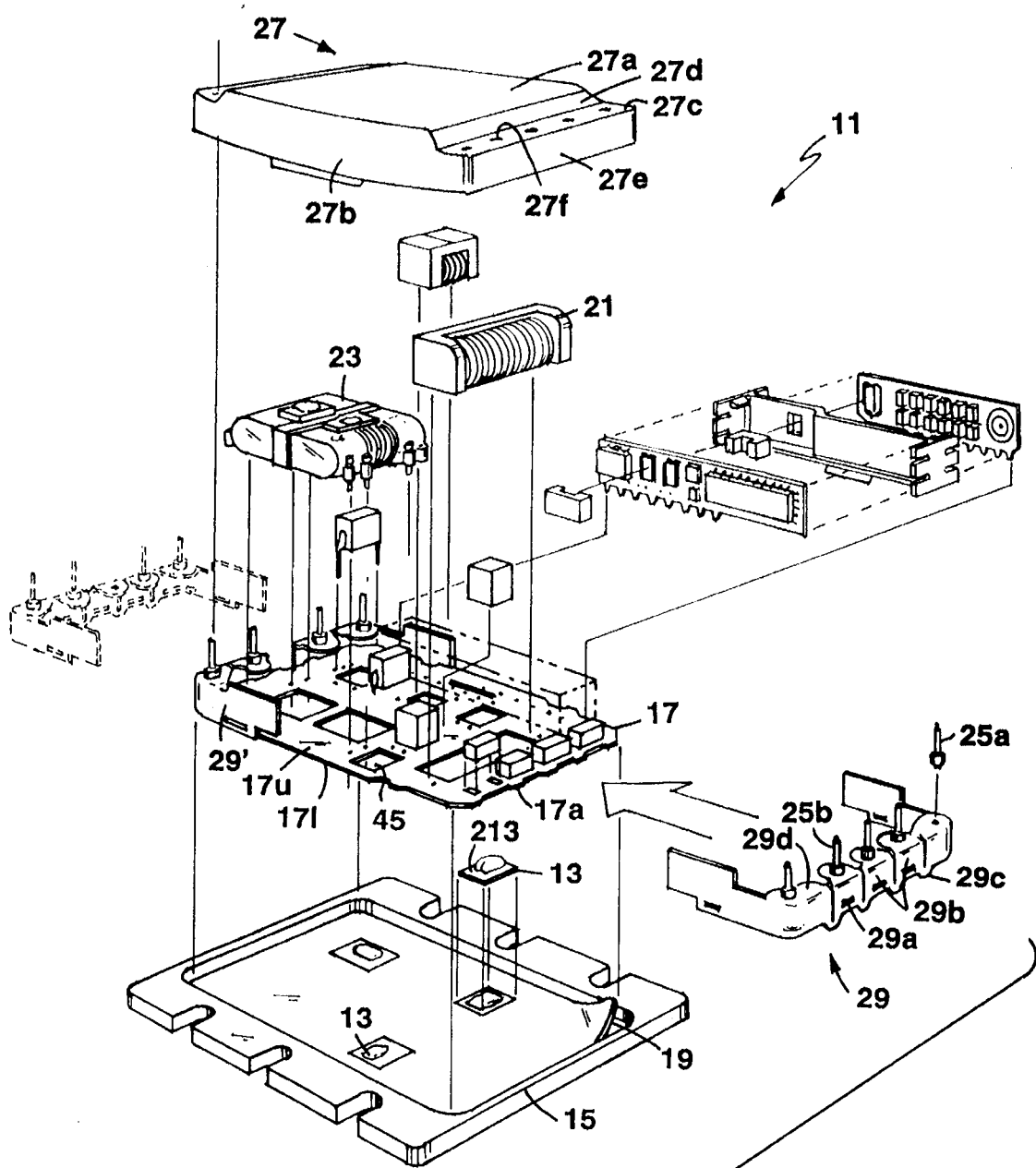
FIG. 2a is a perspective exploded view of component packaging according to the invention.

Referring to FIG. 2a, in the packaging 11 provided by this invention, a power-dissipating electronic component 13 is mounted directly on a thermally conductive (e.g., aluminum) baseplate 15. A multilayer printed circuit board (PCB) 17 is placed over the power-dissipating component and electrical connections are made directly between component 13 and the PCB. The power-dissipating component 13 includes a substrate 213. The thickness of substrate 213 defines a gap between lower side 17L of the PCB and the baseplate 15. An insulating sheet 19 is placed in that gap.

Upper side 17U of the PCB is used to mount components (e.g., inductor 21, transformer 23) which then fit within the space between upper side 17U and the upper wall of the case 27a. Low-profile components such as SMD resistors may also be mounted on lower side 17L of the PCB.

Figure 1:
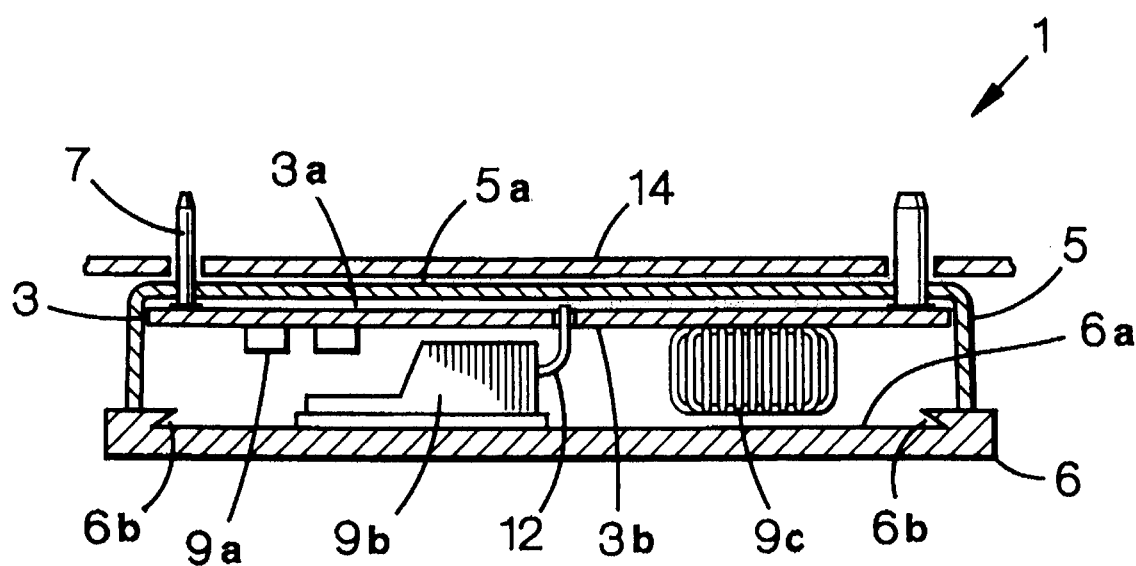
FIG. 1 is a cross-sectional side view of prior art component packaging.

The power-dissipating component is mounted directly to both the baseplate 15 and the PCB 17. Accordingly, thermal resistance between the power-dissipating component and the baseplate is low, while the need for connecting leads (leads 12 in FIG. 1) is eliminated. Elimination of the leads simplifies manufacture because proper placement and soldering of the leads is difficult. Also, the leads exhibit parasitic inductance and resistance which, in high frequency circuits (e.g., above 500 KHz), contribute to undesirable side effects during circuit operation, e.g., slowing of rise times and introduction of high-frequency oscillatory ringing.

Connections from pins 25a and 25b to the PCB 17 are made via conductive links which are initially formed as fences 29, 29'. Fences 29, 29' are mounted along two of the edges of the PCB and wrap around the corners of the PCB. The links then project up toward the upper wall of the case in a direction perpendicular to the PCB. The fences have slots 29a which mate with protrusions 17a formed along the edges of the PCB. The links 29b (see also FIG. 5a) are initially connected by severable portions 29c, which are clipped away during manufacture.

Each fence link has a portion 29d that is bent at right angles to the main part of the link. Each portion 29d corresponds to one of the pins 25a–25b. The bent portions 29d extend parallel to the PCB, thus giving the fence an inverted L-shape in cross-section. Pins 25a–25b are connected to bent portions 29d, thus leaving the space between the bottoms of the pins and the PCB available for circuit components. In the example of a power converter circuit, large pins 25a are used at the corners of the board for power connections; smaller pins 25b are used for control terminals. The relative sizes of the pins can be adjusted according to the power and control requirements of the power converter. The bottom of each link is soldered to a corresponding run on the PCB.

The breadth of the interconnection path between the link and the run is greater for the power links at the corners of the board than for the control links. This broader interconnection path provides a greater current carrying capacity. This is especially useful, for example, in the context of packaging a DC—DC power converter (e.g., where PCB 17 may be a four-layer board approximately 1.5 inches in width, 2.2 inches in length and 0.030 inches thick). Such a converter may deliver 30 Amps of current to a load via the converter output pins (pins 25a). However, the thickness of the traces on the four layers of the PCB is a small fraction of the total thickness of the PCB. Without the broad and relatively thick links of the fence, it would be necessary to devote a large amount of trace area on the PCB to carry the large current. Use of the fence links obviates this problem as the full thickness of the fence (e.g., 0.030 inch) is available for carrying current. As a result, the amount of trace area on the surface of the board dedicated to carrying large currents can be minimized. Also the fence links reduce the impedance of the path which carries the current.

The fence links also assure that the electrical connections between the links and the PCB are close to the source of current. For example, the protrusions 17a along the edge of the PCB may be placed at locations which are close to the source of current (e.g., one or more of the connecting pins on the transformer 23 or inductor 21). Thus, the substantial current-carrying capacity of the fence links may be used to advantage starting at a point along the edge of the PCB which is physically close to the source of the current, thus minimizing output impedance and losses associated with flow of current from internal circuitry to the output pins of the converter.

Once the baseplate 15, PCB 17 with mounted components, and fences 29, 29' with pins 25a–25b have been assembled, a case 27 is attached to the baseplate. Case 27 is molded of a thermoplastic material (e.g., Valox or Ultem) and is generally cup-shaped. The case includes an upper wall 27a, sloped transitions 27d connecting the upper wall with steps 27c, side walls 27b, and end walls 27e. A row of holes 27f for the pins is arranged along each of the steps 27c.

Figure 2D:
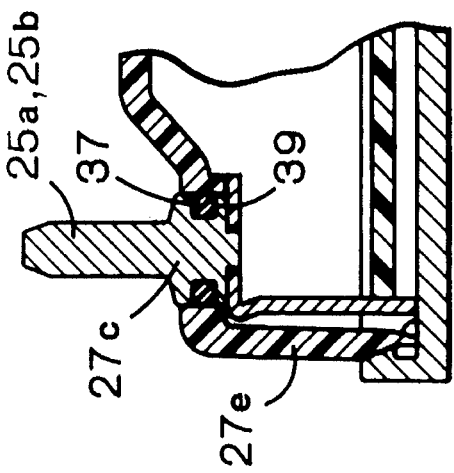
FIGS. 2b–2f are side sectional views of alternate pin/case structures.
Figure 2C:
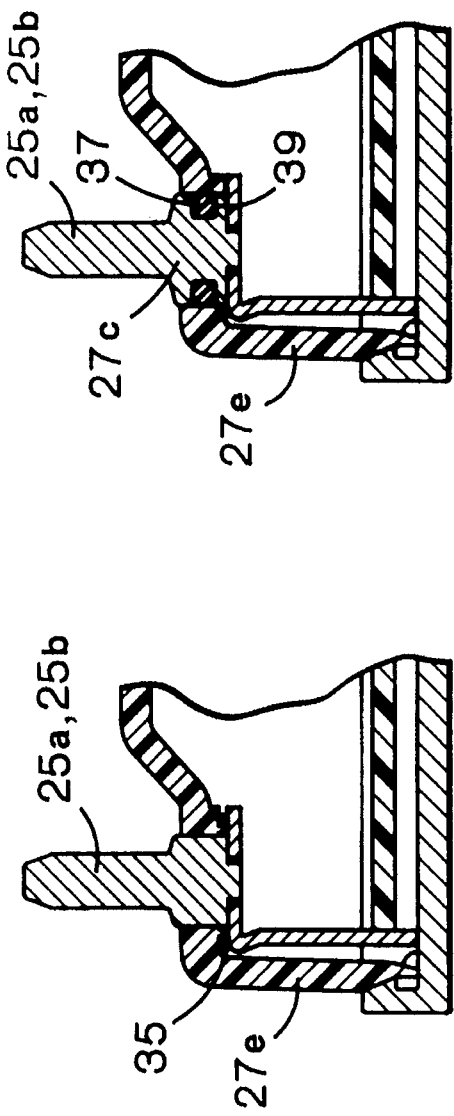
Figure 2B:
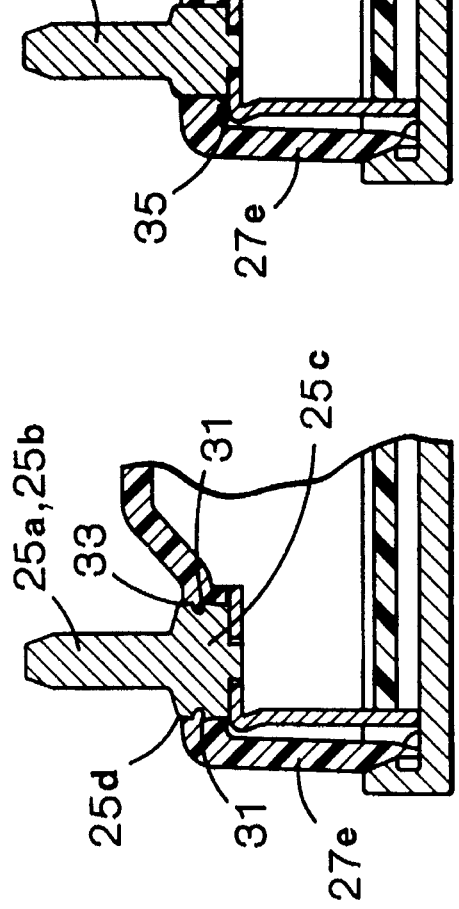

To prevent leakage of liquid encapsulating material (prior to curing) the pins 25a–25b are sealed to the case. In one scheme (FIG. 2b), a sharp ridge 31 is formed on a base 25c of a pin 25. The holes (e.g., 27f in FIG. 2A) are small enough to assure a friction seal between the pins and the case. In FIG. 2b, the pin is pulled through the hole, causing the relatively large diameter upper shoulder 25d of the pin to stretch the inside diameter of the corresponding hole. The shoulder of the pin then snaps into a groove 33 surrounding the outer edge of the aperture, causing the sharp serrations 31 to bite into the inner walls of the plastic case material to form a seal.

Figure 2F:
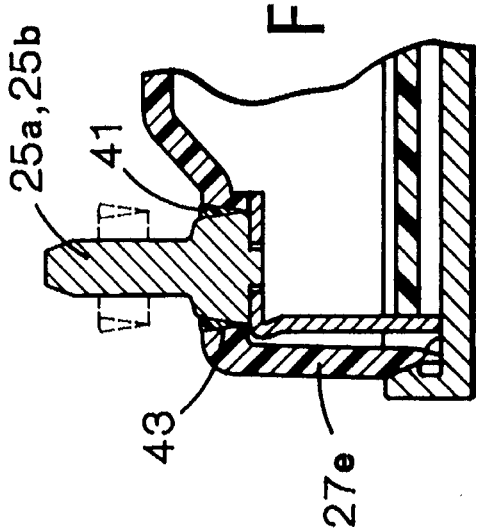
Figure 2E:
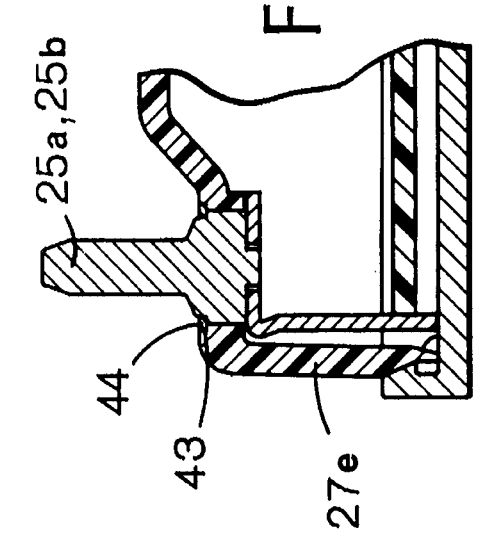

Other schemes are possible. In FIG. 2c, a membrane 35 is placed over the pins 25a–25b before the pins are pushed through the holes in the case 27. In FIG. 2d, a compliant O-ring 37 is seated in a groove 39 formed in the base 25c of the pin. In FIGS. 2e and 2f, a thermoplastic washer 41 is placed in a recess 43 formed between the pin and the hole. The ring-shaped thermoplastic washer 41 can be flat (FIG. 2e) or beveled (FIG. 2f). Heat is applied in the vicinity of the washer causing the plastic to soften to create a seal. All of the schemes in FIGS. 2b–2f may be used with both small diameter and large diameter pins.

Figure 3:
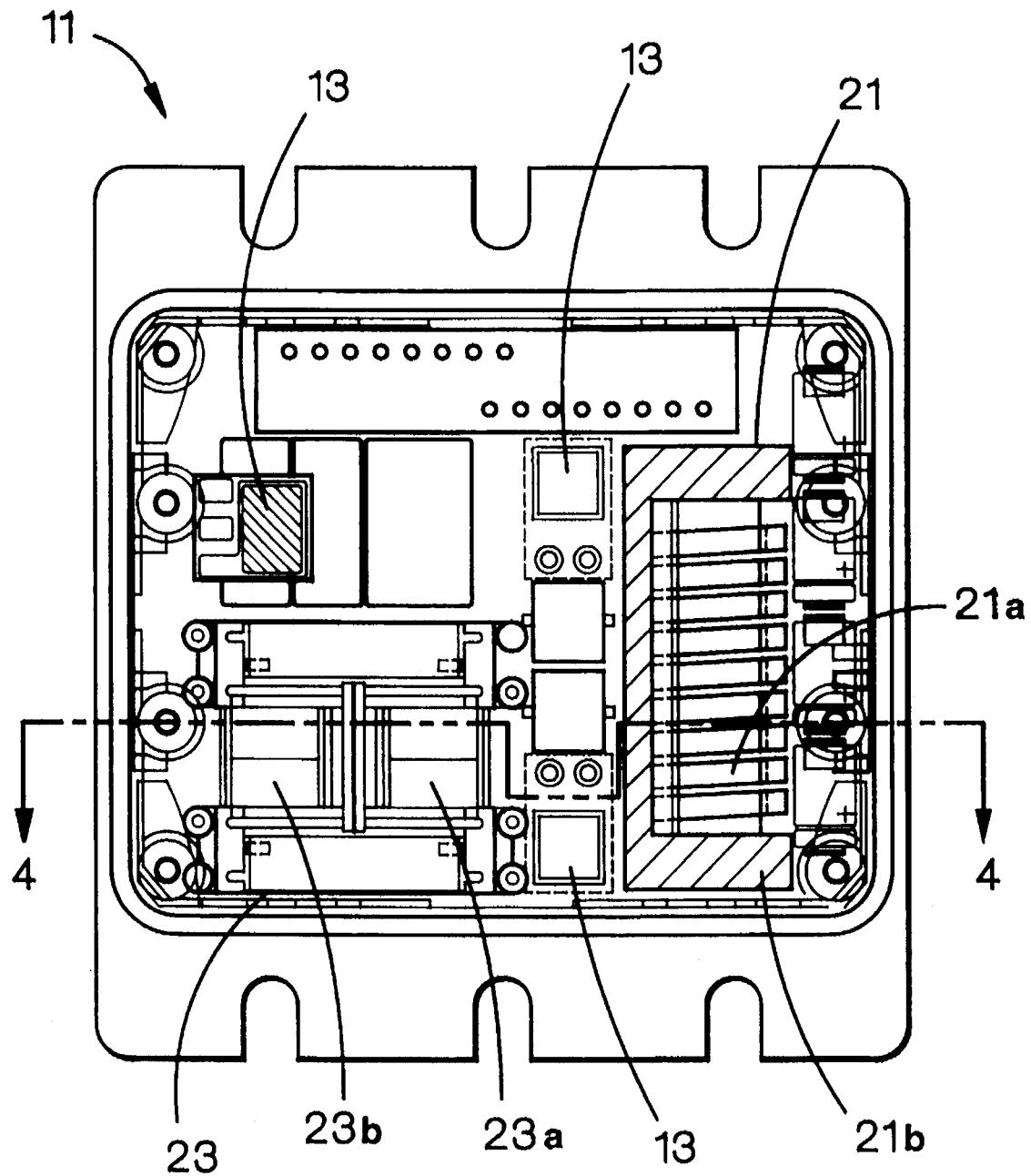
FIG. 3 is a top view of the packaging with the case removed.
Figure 4A:
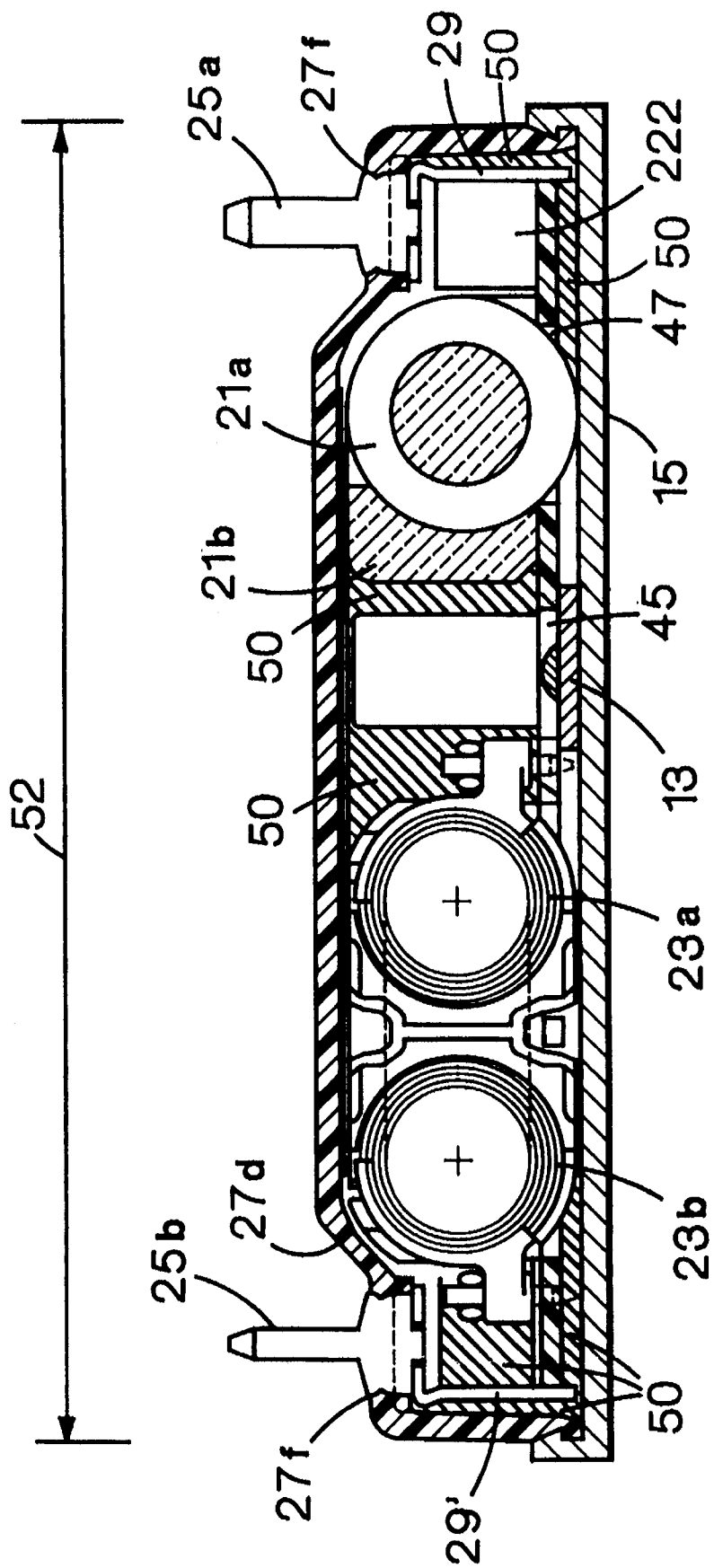
FIG. 4a is a side sectional view of the packaging of FIG. 3 taken along lines IV–IV.

As seen in FIGS. 3 and 4a, in the case of a power converter, the components being packaged include power-dissipating components 13 and large components such as an inductor 21 and a transformer 23. The inductor 21 may have a winding 21a and a ferrite core 21b. The transformer 23 may have two windings 23a, 23b. In FIG. 4a, (see also FIG. 2a) holes 45 in the PCB 17 are positioned over power-dissipating components 13 which have been previously mounted directly to the baseplate 15. When the PCB is mounted on the baseplate 15, fences 29 and 29', with pins 25a–25b attached, have already been assembled to the PCB, and the severable parts of the fence have already been severed. Once the PCB is in place, the case 27 is mounted over the pins with the pins extending through holes 27f. The large components such as inductor 21 and transformer 23 are located on the PCB in the space beneath the sloped transitions 27d. Space is further conserved by mounting the inductor 21 and the transformer 23 on the PCB 17 so that windings 23a, 23b of the transformer and winding 21a of the inductor extend partially through holes 47 formed in the PCB. This mounting arrangement allows part of the bodies of windings 21a and 23a–b to occupy the same vertical clearance as the thickness of PCB 17, thus allowing the overall thickness of the packaging to be reduced. At the same time, the windings are effectively cooled by minimizing the thermal impedance between the windings and the baseplate.

Other smaller components 222 are mounted beneath the pins and take advantage of space near the edges of the PCB which would not otherwise be available if the fence links were not provided in place of longer pins running directly to the PCB.

For the purpose of attaching case 27 to the baseplate 15 (see FIGS. 4b and 4c), teeth 49 are formed along the lower edge of at least the two side walls 27b of the case (only one tooth is shown). A matching groove (or detent) 15a is undercut along the edge of pocket 15b. A portion of PCB 17 is also shown in FIG. 4c. As the case is brought down over the pocket, the side walls 27b of the case are urged inward due to contact between the teeth 49 and angled surfaces 51 formed on the baseplate. The angled surfaces 51 lead the teeth 49 into the grooves 15a. Once the teeth 49 are locked into grooves 15a, the case 27 cannot be removed without pressing in on side walls 27b of the case. To ensure a snug fit between the case and sloped surface 51 of the baseplate, a small amount of outward curvature d1 (exaggerated in FIG. 4b) is provided along the side walls of the case, thus prebiasing the case.

The "snap in" structure shown in FIGS. 4b and 4c allows the use of a soft encapsulant 50, and thus eliminates the need for a buffer coating on components within the package. The encapsulant 50 in FIGS. 4a and 4b need only have low compressibility, so as to resist any compressive forces which might tend to squeeze the side walls of the case together. As long as those side walls cannot be squeezed together, the case cannot be pulled away from the baseplate. The incompressibility of the material 50 filling the space d2 between the lower edge of side wall 27b of the case and the outer edge of the PCB 17 prevents the teeth from moving out of the groove 15a. The encapsulant 50 thus forms part of a non-compressible span 52 of encapsulating material 50 and components extending between the places on the two side walls of the case where the teeth are located. At the same time, the injected material 50 is sufficiently soft not to damage the components during expansion or contraction.

In the example of a DC—DC power converter containing magnetic components and surface mounted passive components and semiconductors, Mineral-filled, Two-component Epoxy system #LA4001-12, made by Emerson & Cuming, Woburn, Mass. 01880, has adequate compressive strength to keep the teeth 49 engaged within the groove 15a while providing enough resilience for operation over a temperature range of –40 C. to 100 C. and without the use of a buffer coating.

Figure 5A:
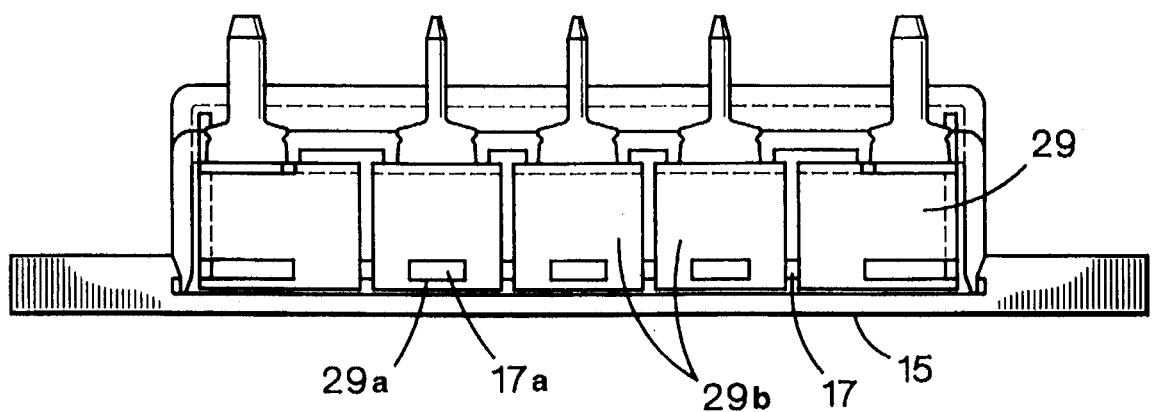
FIG. 5a is an end view, partially broken away, of the packaging of FIG. 3.

Referring to FIG. 5a, fence 29 is mounted on the edges of PCB 17 with the tongues 17a on the PCB projecting into the slots 29a. Each link 29b has its own slot and is supported by a tongue 17a.

Figure 5B:
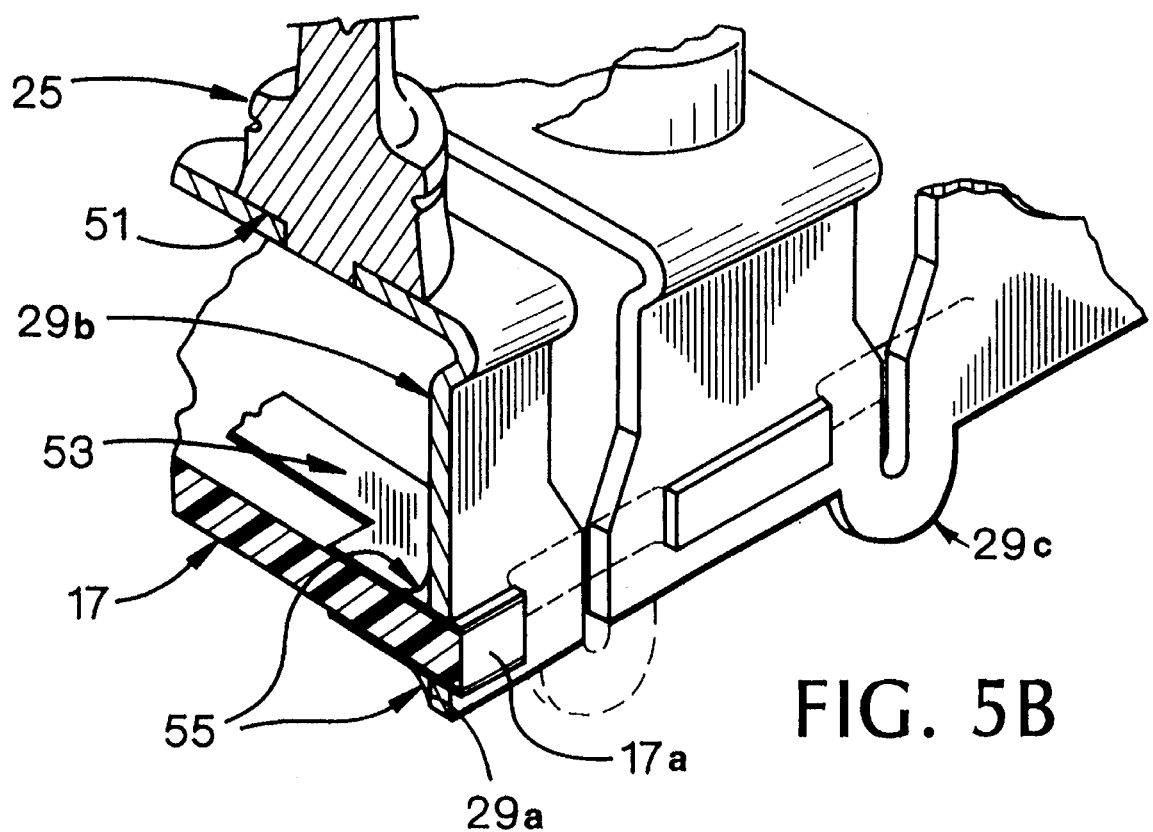
FIG. 5b is an exploded perspective cutaway view of a portion of the packaging of FIG. 3.

As shown in FIG. 5b, fence 29 is die cut from a thin flat sheet of copper in a pattern which includes the links 29b, the slots 29a, and the severable portions 29c connecting the links. Each pin 25 is soldered (51) to its corresponding link 29b. Conductive traces 53 on the PCB extend onto the tongues 17a. When the fence 29 is being attached to the PCB, traces 53 are electrically connected by soldering to the appropriate links and thus are connected to the appropriate pin 25. The solder also provides mechanical support of the fence to the PCB during the manufacturing process; the encapsulant subsequently provides more permanent support. The fence may be soldered to traces on either or both the upper and lower surfaces of the PCB.

After the fence is attached to the PCB, the severable portions 29c extend below the PCB. These severable portions are then cut (see phantom lines in FIG. 5b) to electrically separate the links 29b. Initially forming the links as interconnected fences effectively reduces the number of parts which need to be handled and attached to the PCB during assembly and ensures proper alignment of the links 29b.

Figure 6B:
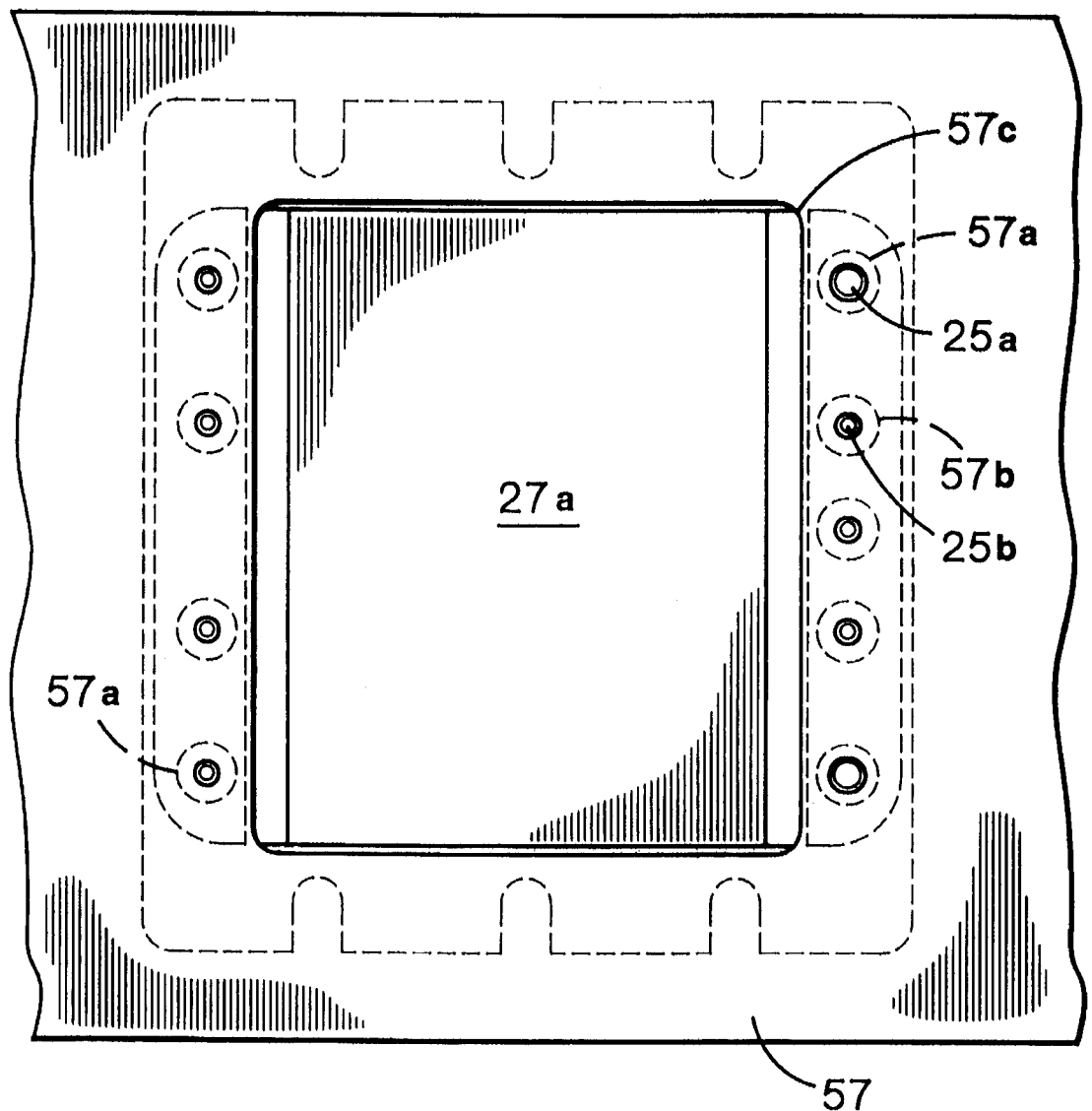
FIGS. 6a and 6b are side and top views, respectively, of the packaging of FIG. 3 mounted on a printed circuit board.
Figure 6A:
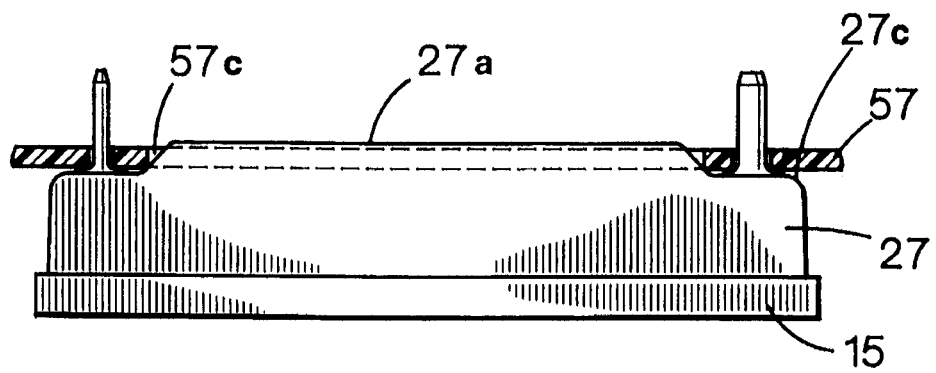

As shown in FIG. 6A, the steps on the case are useful in mounting the package to an external circuit board 57. As shown in FIG. 6B, circuit board 57 has holes 57a–57b corresponding to pins 25a–25b, and a distinct (i.e., separate from the pin holes) large rectangular hole 57c corresponding to the upper wall 27a of the case 27. The steps of the case allow the upper wall 27a to lie within hole 57c with the circuit board 57 resting on the steps. The effective height of the combined package and circuit board is reduced because a portion of the height of the package is coextensive with the thickness of the circuit board 57.

Figure 7B:
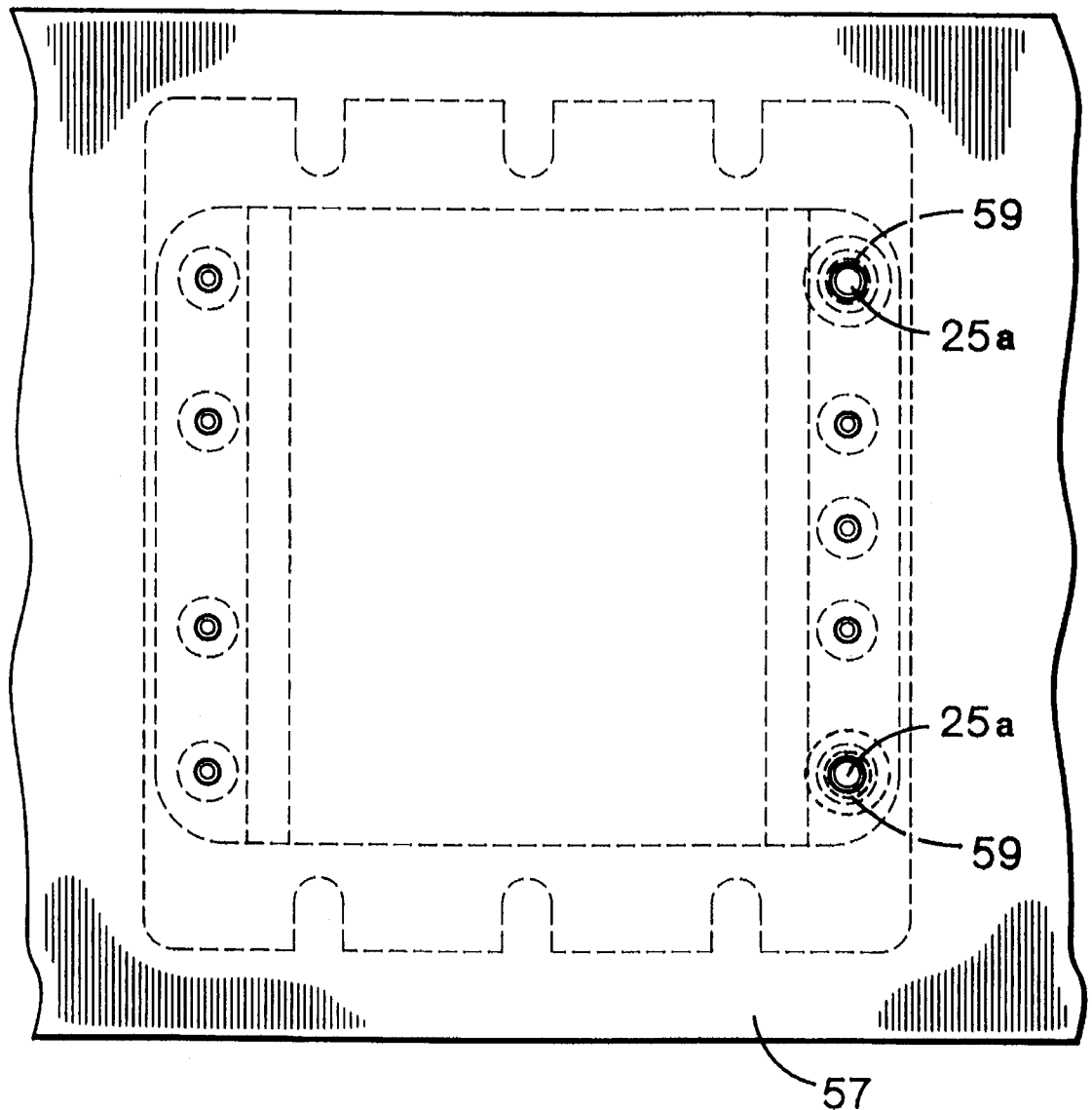
FIGS. 7a and 7b are side and top views, respectively, of another mounting technique.
Figure 7A:
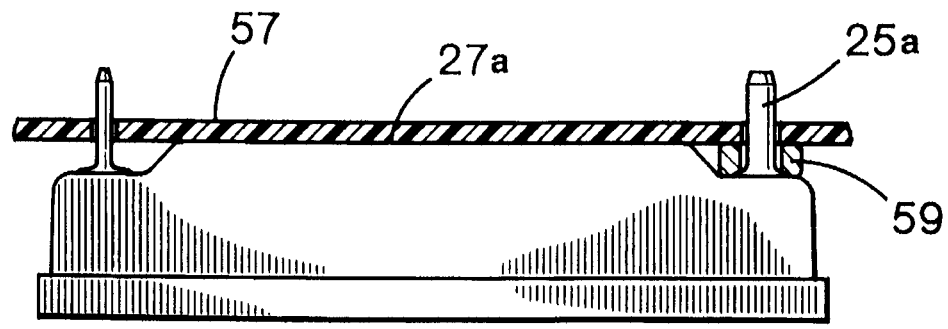

Alternatively, as shown in FIGS. 7a–7b, ferrite rings or "beads" 59 are placed on the pins 25a to reduce high-frequency noise. Circuit board 57 then fits flush against the upper wall 27a of the case, leaving a space for the ferrite rings 59.

In alternative pin structures, FIGS. 8a–8d, solder pins are replaced by male or females threaded pins, which permit higher current carrying capability and easier removal and remounting. The threaded schemes include either an internally threaded screw base 61 and a matching screw 63 or an externally threaded stud 62 and a corresponding nut 64. The screw base 61 (or stud 62) is connected to the fence link 29 and extends through the case 27 in the same manner as pins 25a–25b. No modifications are necessary to either the case 27 or the fence 29. Any of the alternative structures of FIGS. 2b–2f may be used with the threaded pins.

Circuit board 57 has circuit traces or conductive eyelets 65 for electrical connection with the screw 63 or nut 64 and the base 61 or stud 62 once the threaded assembly has been tightened. The resulting electrical connection between the fence link 29 and the circuit board 57 is ensured.

Figure 8A:
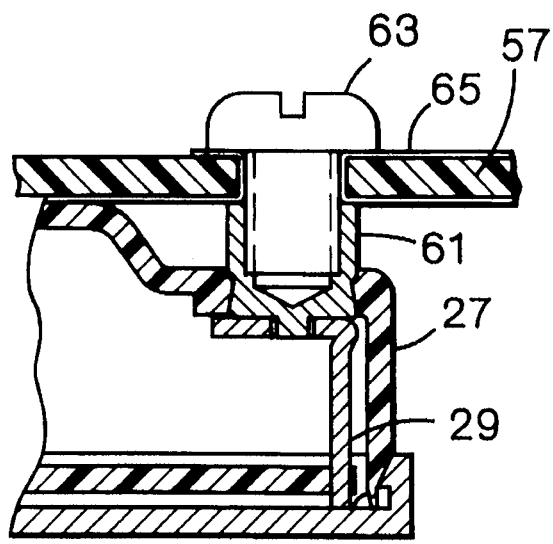
FIGS. 8a–8d are sectional side views of alternate mounting pin structures.
Figure 8B:
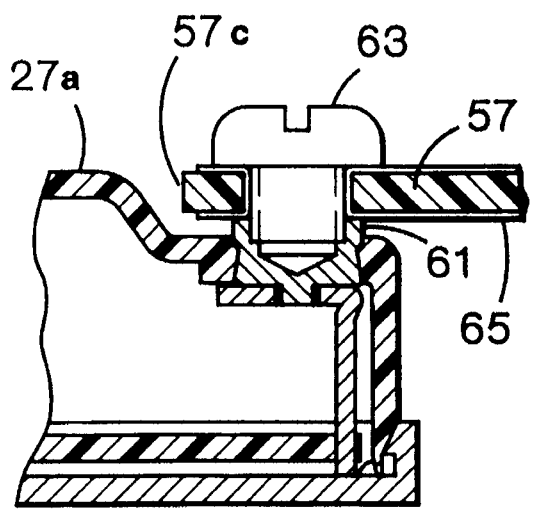
Figure 8C:
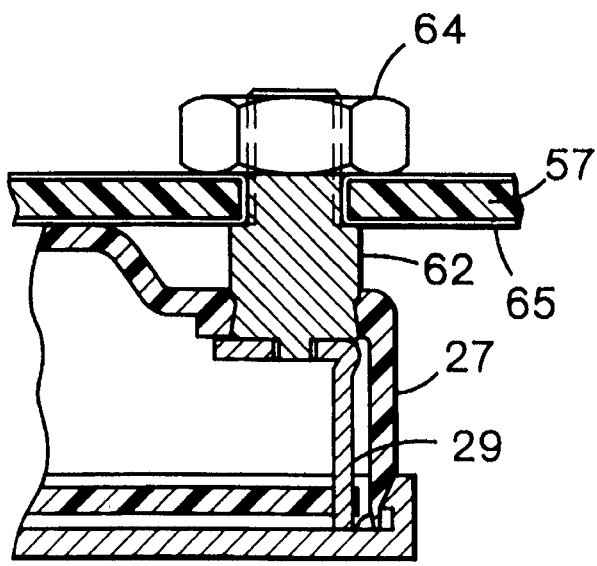
Figure 8D:
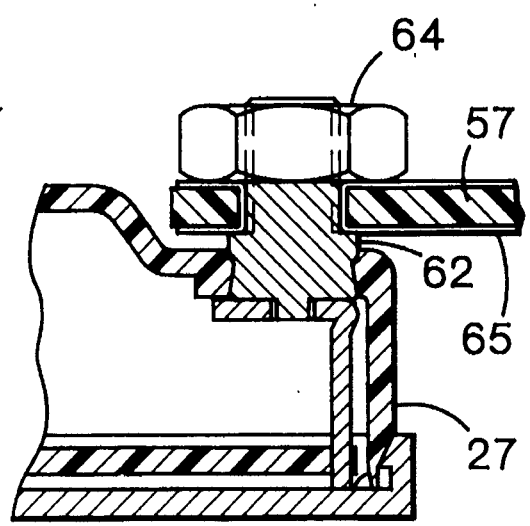

In FIG. 8a, the internally threaded screw base 61 is long enough to hold the upper wall 27a of the case flush against the circuit board 57. Screw 63 is attached from the rear of circuit board. In FIG. 8b, a shorter screw base 61 allows the upper wall 27a of the case to extend through hole 57c. FIGS. 8c–8d correspond to FIGS. 8a–8b with the base and screw replaced with stud 62 and nut 64.

Figure 9:
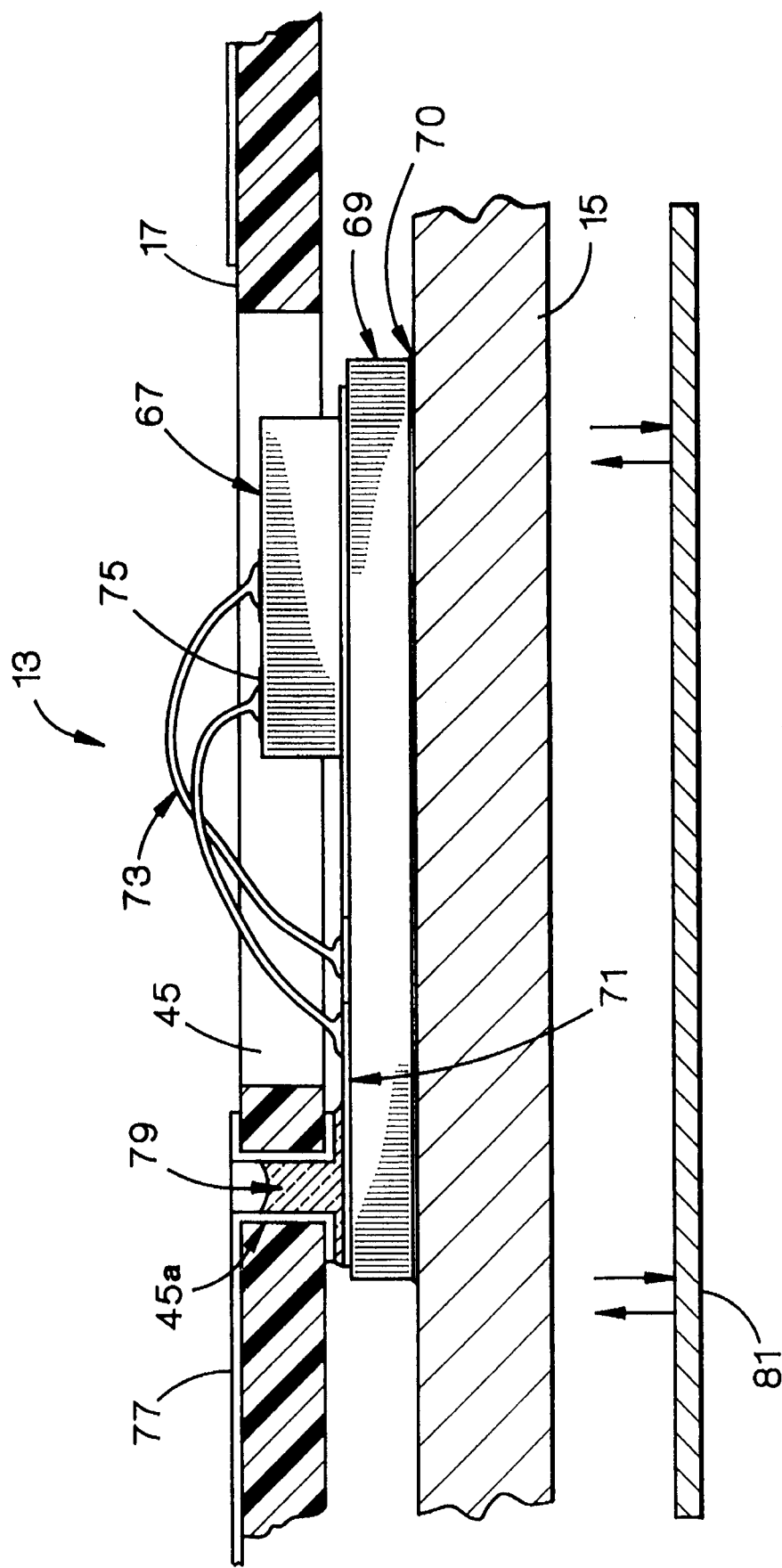
FIG. 9 is an enlarged side sectional view which illustrates how a power-dissipating component is mounted in the packaging.
Figure 10:
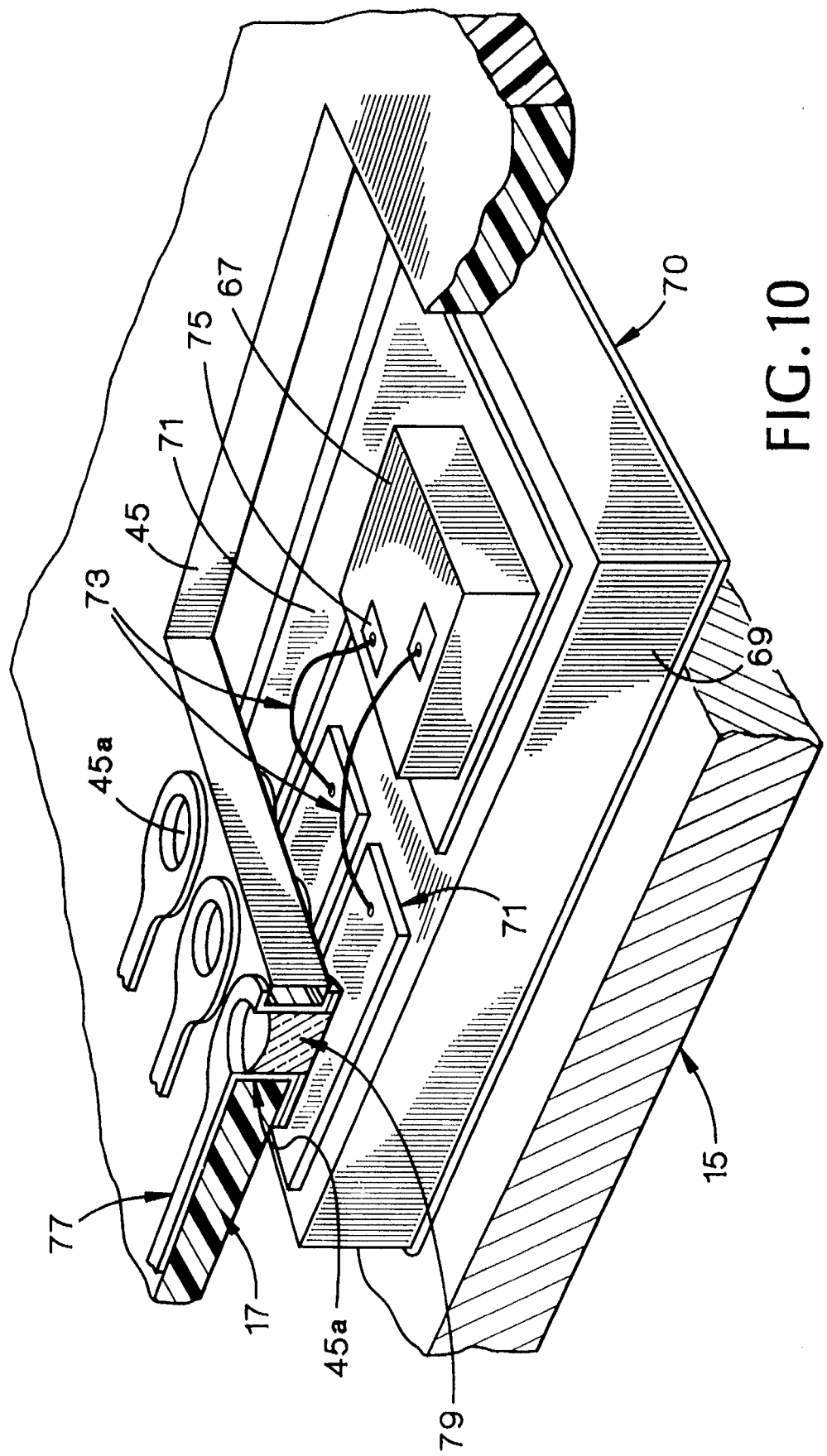
FIG. 10 is an enlarged perspective view, partially broken away, of a power-dissipating component mounted in the packaging.

Referring to FIGS. 9 and 10, a power-dissipating component 13 is mounted on the baseplate 15 and attached to PCB 17 as follows. A semiconductor die 67 (the power dissipating device) is mounted on an electrically nonconductive substrate 69 (e.g., alumina ceramic). The substrate 69 is glued (using adhesive 70) on baseplate 15 and provides electrical isolation and efficient heat transfer between the die and the baseplate. Also formed on the substrate 69 are conductive pads 71 which are electrically connected by bond wires 73 to terminals 75 on the top of the semiconductor die 67.

One pad 71 extends under and is soldered directly to the semiconductor die (the solder is not shown). The extended pad may be used for making one of the electrical connections to the die, as the bottom surface of the semiconductor die is frequently one of the terminals of the device (e.g., the anode or cathode of a diode or the drain terminal of a field-effect transistor). The extended pad, if made of a material (e.g., copper) which has a thermal resistance much lower than that of the underlying substrate 69, will act as an essentially isothermal surface which spreads heat from the die over a relatively large surface of the substrate. This reduces the overall thermal resistance between the relatively smaller die 67 and the baseplate 15. The relatively large area of the conductive material of the pad, which might, for example, be 0.008 inch thick copper direct-bonded to the alumina substrate 69 (see Babcock et al., U.S. Pat. No. 3,766,634), provides a thermally conductive path for removing heat from the die and spreading the heat over a relatively large area of the surface of the substrate. By acting as an essentially isothermal surface, the extended pad provides means for passing heat down through a relatively large cross section of the substrate, thereby reducing the thermal resistance between the die and the baseplate and making this thermal resistance relatively independent of die size.

PCB 17 has a hole 45 through which the semiconductor die 67 and the bond wires 73 can pass, and several smaller separate holes 45a corresponding in number and location to the pads 71. A conductive run 77 is formed on the top and bottom surfaces of PCB 17 in the vicinity of each hole 45a and also through the holes themselves thus creating conductive through holes. Electrical connection between a conductive run 77 and the corresponding pad 71 is achieved by soldering (79), e.g., reflow soldering. The relatively large surface area between the solder and the inner wall of the through hole provides substantial mechanical strength to the solder bond.

This method of connecting a power-dissipating component to the PCB simplifies assembly. Because of efficient transfer of heat between baseplate 15 and substrate 69, solder 79 can be melted simply by applying a heat plate 81 to the bottom of baseplate 15 (see FIG. 9). Easy removal of the circuit board from the baseplate is also possible simply by again applying a heat plate to the bottom of the baseplate. This avoids tedious and destructive manual soldering and de-soldering.

One method of soldering the PCB to the substrate uses the inherent heat capacity of the baseplate itself. Solder paste of a known melting temperature (e.g., 183 degrees C.) is applied to the conductive runs 77, and the fully constructed PCB assembly is preheated to a fixed temperature which is consistent with the temperature ratings of the components mounted to the PCB (e.g., 125 degrees C.). This reduces the amount of heat subsequently required to melt the solder paste and also encourages out-gassing of volatile solvents that may be included in the solder paste. The baseplate 15, with the power dissipating components mounted on it, is heated to a temperature consistent with the temperature ratings of the power dissipating components (e.g., 250 degrees C.). Once the baseplate is up to temperature, it is removed from the heat plate 81 and the PCB is immediately placed down in direct contract with the substrates. The heat stored in the baseplate is transferred to the solder paste causing the paste to melt and a solder joint to be formed.

As seen in FIG. 10, hole 45 in PCB 17 saves space because the height of the semiconductor die 67 is co-extensive with the height of the PCB 17.

Other embodiments are within the scope of the following claims. For example, the techniques could be used in housing a variety of devices other than the power converters used in the example given above.

What is claimed is:

1. A package for electrical components, comprising a base and a case which together define an internal chamber for the electrical components, the case having two opposing side walls, the two side walls having respective teeth extending laterally in opposite directions and away from each other, the base having two opposing detents extending laterally in opposite directions and toward each other, the detents being located and configured to permit the case to be snapped onto the base with the teeth held under the detents, and a non-compressible resilient encapsulating material which completes a non-compressible span of encapsulating material and components extending between the teeth on the two side walls of the case.

2. The package of claim 1 wherein said span of encapsulating material and components includes a circuit board mounted within the package and between the teeth on the two side walls of the case.

3. The package of claim 1 wherein said side walls are resilient and biased to apply outward lateral forces to said teeth when said case is mounted on said base.

* * * * *